(12) United States Patent
Quevy

(10) Patent No.: US 7,514,760 B1
(45) Date of Patent: Apr. 7, 2009

(54) IC-COMPATIBLE MEMS STRUCTURE

(75) Inventor: Emmanuel P. Quevy, El Cerrito, CA (US)

(73) Assignee: Silicon Clocks, Inc., Fremont, CA (US)

( * ) Notice: Subject to any disclaimer, the term of this patent is extended or adjusted under 35 U.S.C. 154(b) by 4 days.

(21) Appl. No.: 11/716,284

(22) Filed: Mar. 9, 2007

(51) Int. Cl.
*H01L 29/78* (2006.01)
*H01L 21/00* (2006.01)

(52) U.S. Cl. .................. 257/416; 257/414; 257/415; 438/50; 438/53

(58) Field of Classification Search .............. 257/414, 257/415, 416, 417; 438/50, 52, 53
See application file for complete search history.

(56) References Cited

U.S. PATENT DOCUMENTS

| | | | |
|---|---|---|---|
| 4,838,088 | A | 6/1989 | Murakami |
| 6,846,691 | B2 | 1/2005 | Hsu et al. |
| 7,023,065 | B2 | 4/2006 | Ayazi et al. |
| 2005/0250236 | A1 | 11/2005 | Takeuchi et al. |
| 2006/0108675 | A1* | 5/2006 | Colgan et al. ............... 257/684 |
| 2006/0273416 | A1* | 12/2006 | Ayazi et al. .................. 257/414 |
| 2008/0054759 | A1* | 3/2008 | Ayazi et al. .................. 310/309 |

OTHER PUBLICATIONS

Lund, Jennifer L. et al., "A Low Temperature BI-CMOS Compatible Process for MEMS RF Resonators and Filters," Solid-State Sensor, Actuator and Microsystems Workshop, Jun. 2-6, 2002, pp. 38-41.
Jahnes, C. V., et al., "Simultaneous Fabrication of RF MEMS Switches and Resonators Using Copper-Based CMOS Interconnect Manufacturing Methods," IEEE, 2004, pp. 789-792.
Wang, Jing, et al., "1.156-Ghz Self-Aligned Vibrating Micromechanical Disk Resonator," IEEE Transactions on Ultrasonics, Ferroelectrics, and Frequency Control, Dec. 2004, pp. 1607-1628, vol. 51, No. 12.

* cited by examiner

*Primary Examiner*—Fernando L Toledo
(74) *Attorney, Agent, or Firm*—Blakely, Sokoloff, Taylor & Zafman

(57) ABSTRACT

An IC-compatible MEMS structure and a method to form such a structure are described. In an embodiment, an integrated circuit having a MEMS device is formed. The structure comprises a plurality of semiconductor devices formed on a substrate. A plurality of interconnects is above and coupled with the plurality of semiconductor devices, incorporating the plurality of semiconductor devices into the integrated circuit. A MEMS resonator is formed above, and coupled with, the plurality of interconnects. In one embodiment, the MEMS resonator is comprised of a member and a pair of electrodes. The pair of electrodes is electrically coupled with the plurality of interconnects.

24 Claims, 12 Drawing Sheets

IC-COMPATIBLE MEMS STRUCTURE

BACKGROUND OF THE INVENTION

1) Field of the Invention

The invention is in the field of Microelectromechanical Systems (MEMS).

2) Description of Related Art

For the past several years, MEMS structures have been playing an increasingly important role in consumer products. For example, MEMS devices, such as sensors, detectors and mirrors, can be found in products ranging from air-bag triggers in vehicles to displays in the visual arts industry. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictates that the processes used to fabricate such MEMS devices need to be extremely sophisticated.

A recent fabrication challenge in the field MEMS devices is the integration of MEMS structures with complimentary metal-oxide-silicon (CMOS) architectures. These devices hold the promise of reducing cost and power requirements in integrated circuits (ICs) for a variety of applications. However, several issues arise as a result of integrating MEMS technology with semiconductor IC technologies. For example, once fabricated, semiconductor ICs may have a temperature threshold above which the IC irreversibly degrades. Thus, it may be difficult to subsequently fabricate a MEMS device incorporated with a semiconductor IC structure. One approach has been to form the semiconductor IC on an already fabricated MEMS structure. This process has its limitations, however, since many semiconductor ICs require the use of virgin substrates for optimal performance.

Another approach has been to fabricate a MEMS device in the back end-of-line (BEOL) processing of a semiconductor IC, incorporating the MEMS structure into a plurality of interconnects. For example, FIG. 1 illustrates a cross-sectional view representing a MEMS resonator integrated with a plurality of interconnects, in accordance with the prior art. A MEMS resonator 102 having a resonating member 104 is connected to a plurality of interconnects 106 in a BEOL portion 100 of a semiconductor IC. A single port electrode in one level of the plurality of interconnects 106 drives and senses the resonating member 104 from a different level of the plurality of interconnects 106. Drawbacks to this approach stem from the requirement that the resonating member and the driver/sensor electrode are in different levels of the plurality of interconnects. This arrangement may be optimized to have only a one-port configuration, and thus undesirably demonstrate increased parasitics, and may exhibit fabrication limitations since each component is in a different level of the interconnects.

Thus, an IC-compatible MEMS structure is described herein, along with a method to fabricate such a MEMS structure.

DETAILED DESCRIPTION

Figure 1:
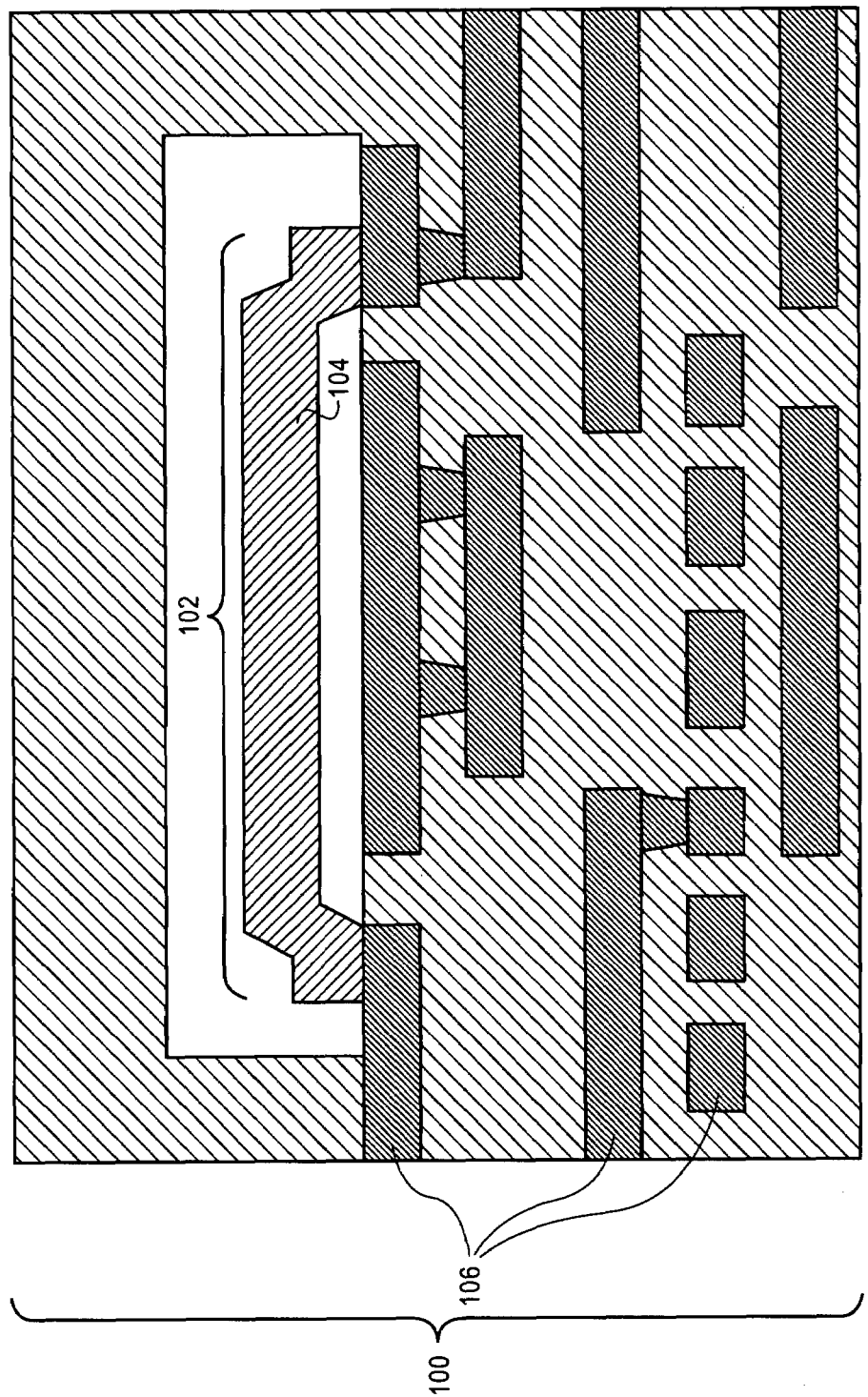
FIG. 1 illustrates a cross-sectional view representing a MEMS resonator integrated with a plurality of interconnects, in accordance with the prior art.

An IC-compatible MEMS structure and a method to form such a structure are described. In the following description, numerous specific details are set forth, such as material compositions and chemical regimes, in order to provide a thorough understanding of the present invention. It will be apparent to one skilled in the art that the present invention may be practiced without these specific details. In other instances, well-known features, such as lithographic parameters and patterning procedures, are not described in detail in order to not unnecessarily obscure the present invention. Furthermore, it is to be understood that the various embodiments shown in the figures are illustrative representations and are not necessarily drawn to scale.

Disclosed herein are an IC-compatible MEMS structure and a method to form an IC-compatible MEMS structure. An integrated circuit having a MEMS device may be formed. In one embodiment, the structure comprises a plurality of semiconductor devices formed on a substrate. A plurality of interconnects is formed above and coupled with the plurality of semiconductor devices, incorporating the plurality of semiconductor devices into the integrated circuit. A MEMS resonator may be formed above and coupled with the plurality of interconnects. In a specific embodiment, the MEMS resonator is comprised of a member, a driver electrode and a sensor electrode, i.e. the MEMS resonator has more than one port. The driver electrode and the sensor electrode are electrically coupled with the plurality of interconnects.

A MEMS structure having a resonating member and more than one port, i.e. distinct driver and sensor electrodes, may enhance the performance and reliability of a MEMS device built from the MEMS structure. For example, in accordance with an embodiment of the present invention, a MEMS resonator is comprised of a resonating member and distinct driver and sensor electrodes. The pair of electrodes is electrically coupled with a plurality of interconnects in order to drive and sense a signal from the resonating member. However, because two ports are provided, parasitics associated with the signal from the resonating member are reduced. By carefully selecting the fabrication conditions of the MEMS resonator, an IC-compatible MEMS structure may be formed. For example, in accordance with an embodiment of the present invention, a MEMS resonator having a resonating member and distinct driver and sensor electrodes is formed in the same plane, e.g. the same functional layer housed in a stack of material layers. In one embodiment, a MEMS structure is fabricated on a CMOS circuit subsequent to formation of the CMOS circuit. In one embodiment, for optimal integration of the MEMS structure with the CMOS circuit, all process steps used to form the MEMS resonator are carried out at a temperature less than approximately 450° C.

A MEMS structure may be fabricated having a resonating member along with distinct driver and sensor electrodes. FIG.

2 illustrates a cross-sectional view representing an IC-compatible MEMS structure, in accordance with an embodiment of the present invention.

Figure 2:
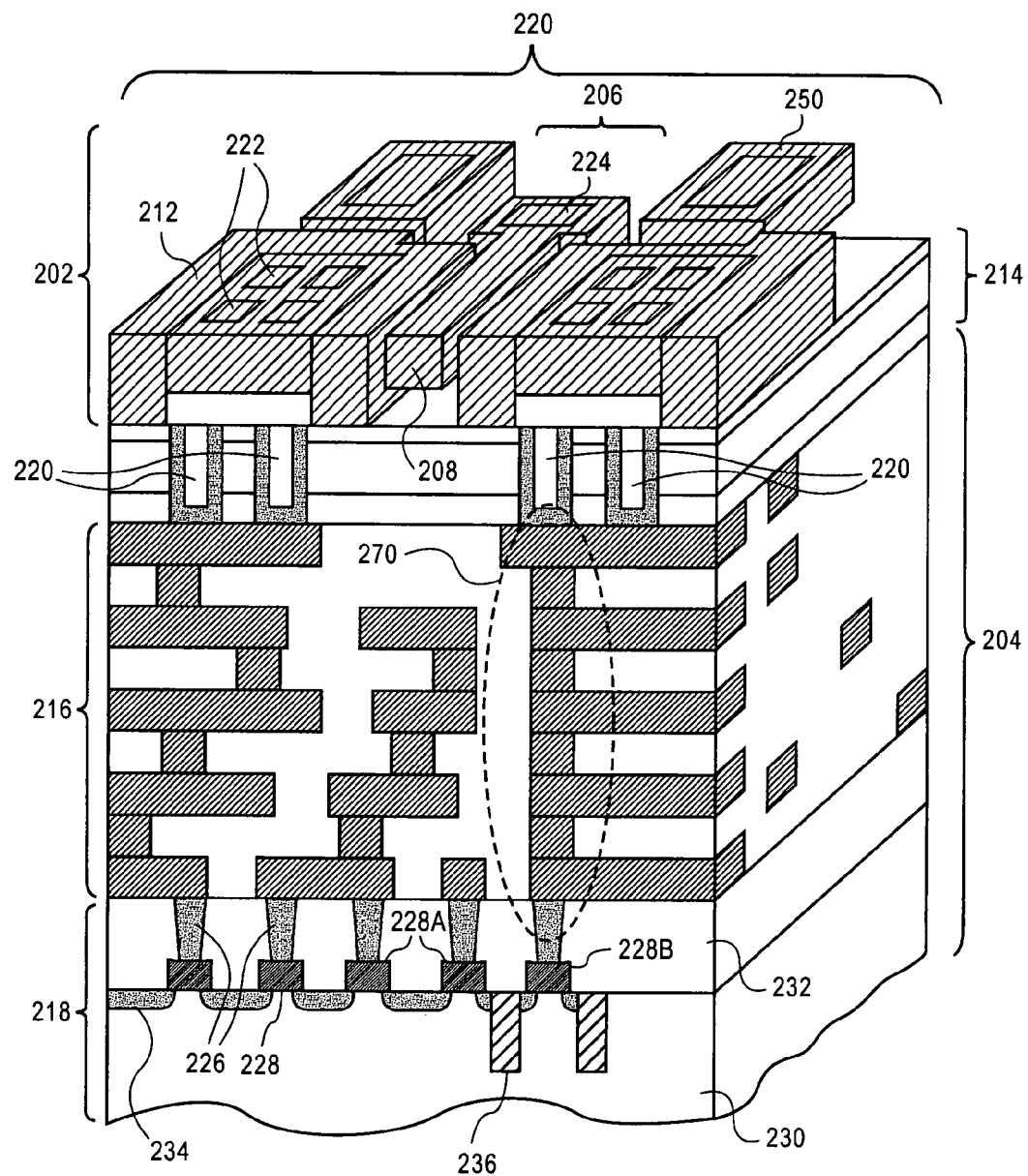
FIG. 2 illustrates a cross-sectional view representing an IC-compatible MEMS structure, in accordance with an embodiment of the present invention.

Referring to FIG. 2, a structure 200 comprises a MEMS structure 202 integrated above a semiconductor IC 204. MEMS structure 202 comprises a member 206 having a suspended portion 208 in between a driver electrode 210 and a sensor electrode 212 and suspended above an isolation stack 214. Semiconductor IC 204 comprises a plurality of interconnects 216 above a plurality of semiconductor devices 218. MEMS structure 202 is coupled with the plurality of interconnects 216 via electrical contacts 220 and a first set of couplers 222 in driver electrode 210 and sensor electrode 212. Member 206 of MEMS structure 202 is anchored to isolation stack 214 via a second set of couplers 224 (depicted as one coupler in FIG. 2). The plurality of interconnects 216 is coupled with the plurality of semiconductor devices 218 by device contacts 226, which are coupled with individual semiconductor devices 228 formed on substrate 230.

Structure 200 may be any arrangement that couples a MEMS structure with an integrated circuit. For example, in accordance with an embodiment of the present invention, semiconductor IC 204 comprises a CMOS integrated clocking circuit and MEMS structure 202 is a MEMS clocking device. In another embodiment, structure 200 is comprised of an integrated circuit having a MEMS filter. Thus, MEMS structure 202 may be any device that falls within the scope of MEMS technologies. For example, MEMS structure 202 may be any mechanical and electronic structure having a critical dimension of less than approximately 250 microns and fabricated using lithography, deposition, and etching processes above a substrate. In accordance with an embodiment of the present invention, MEMS structure 202 is a device selected from the group consisting of a resonator, a sensor, a detector, a filter and a mirror. In one embodiment, MEMS structure 202 is a resonator and member 206 is a resonating member. Thus, suspended portion 208 of member 206 may be any suspended feature having a resonant frequency. For example, in an embodiment, suspended portion 208 is a feature selected from the group consisting of a beam, a plate and a tuning fork. In a specific embodiment, suspended portion 208 is a cantilever arm, as depicted in FIG. 2.

Member 206 may have any dimensions suitable for a desired MEMS function. For example, in accordance with an embodiment of the present invention, MEMS structure 202 is a resonator comprised of a cantilever arm 208. The length of member 206 is in the range of 1-250 microns and the length of cantilever arm 208 comprises a portion of the length of member 206 in the range of 50-90%. The height of member 206 is in the range of 0.1-10 microns and the width at portion 208 is in the range of 0.1-100 microns. In one embodiment, the length of member 206 is in the range of 70-90 microns, the height of member 206 is in the range of 0.5-5 microns and the width at portion 208 is in the range of 0.5-5 microns. The distance that suspended portion 208 is suspended above isolation stack 214 may be selected to mitigate the acoustic back-scattering for a desired MEMS function. In one embodiment, the distance that suspended portion 208 is suspended above isolation stack 214 is in the range of 0.1-5 microns. The spacing between suspended portion 208 and electrodes 210 and 212 may be sufficient to generate and collect high quality signals without interfering with a resonating mode of suspended portion 208. In one embodiment, the spacing between suspended portion 208 and electrodes 210 and 212 is in the range of 100-500 nanometers.

Member 206, and thus suspended portion 208, may be formed from any material suitable to withstand a MEMS fabrication process. For example, in accordance with an embodiment of the present invention, member 206 is comprised of a material selected from the group consisting of an insulator, a semiconductor and a conductor. In one embodiment, member 206 is comprised of an insulating material selected from the group consisting of silicon dioxide, silicon nitride, silicon oxy-nitride and a high-K dielectric material. In one embodiment, member 206 is comprised of a semiconducting material selected from the group consisting of silicon, germanium, silicon/germanium, carbon-doped silicon, carbon-doped silicon/germanium and a III-V material. The semiconducting material may also be comprised of dopant impurity atoms. For example, in a specific embodiment, member 206 is comprised of polycrystalline silicon/germanium with a germanium atomic concentration in the range of 50-70% and boron dopant impurity atoms with a total atomic concentration in the range of $1 \times 10^{18}$-$5 \times 10^{20}$ atoms/cm$^3$. In one embodiment, member 206 is comprised of a conductor and is formed from a material selected from the group consisting of copper, aluminum, a metal alloy and a metal silicide. Member 206 may be comprised of a material that is formed by a low temperature process, below the threshold temperature of semiconductor IC 204. Thus, in accordance with another embodiment of the present invention, member 206 is comprised of a material formed at a temperature less than approximately 450° C.

Driver electrode 210 and sensor electrode 212 may be comprised of any material described in association with member 206. In accordance with an embodiment of the present invention, driver electrode 210 and sensor electrode 212 are comprised of substantially the same material as member 206. In one embodiment, driver electrode 210, sensor electrode 212 and member 206 are in the same plane, as depicted in FIG. 2. Dummy structures 250 may be formed near driver electrode 210 and sensor electrode 212 and may comprise the same structural material as driver electrode 210 and sensor electrode 212. In one embodiment, dummy structures 250 are formed to optimize the topography of structures above isolation stack 214 and thus optimize the fabrication process of MEMS structure 202.

First set of couplers 222, used to couple driver electrode 210 and sensor electrode 212 with electrical contacts 220, may be comprised of any conductive material suitable to withstand a MEMS fabrication process. For example, in accordance with an embodiment of the present invention, first set of couplers 222 is comprised of a material selected from the group consisting of a semiconductor material heavily doped with charge-carrier impurity atoms and a conductor. In one embodiment, first set of couplers 222 is comprised of a heavily doped semiconducting material selected from the group consisting of silicon, germanium, silicon/germanium, carbon-doped silicon and a III-V material. In a specific embodiment, first set of couplers 222 is comprised of a group IV material heavily doped with charge-carrier impurity atoms selected from the group consisting of boron, indium, phosphorus, arsenic and antimony. For example, in a particular embodiment, first set of couplers 222 is comprised of polycrystalline silicon/germanium with a germanium atomic concentration in the range of 55-95% and boron dopant impurity atoms with a total atomic concentration in the range of $1 \times 10^{20}$-$5 \times 10^{22}$ atoms/cm$^3$. In another specific embodiment, first set of couplers 222 is comprised of a group III-V material heavily doped with charge-carrier impurity atoms selected from the group consisting of carbon, silicon, germanium, oxygen, sulfur, selenium and tellurium. In one embodiment, first set of couplers 222 is comprised of a conductor and is formed from a material selected from the group consisting of copper, aluminum, a metal alloy and a metal silicide. A low temperature process may be used to form first set of couplers 222. Thus, in accordance with an embodiment of the present invention, first set of couplers 222 is comprised of a material formed at a temperature less than approximately 450° C. First set of couplers 222 may be comprised of a material having a low resistivity. For example, in one embodiment, first set of couplers 222 is comprised of a material having a volume resistivity less than $1\times10^{-5}$ ohms·cm. In comparison with driver electrode 210 and sensor electrode 212, first set of couplers 222 may be relatively more conductive. In an embodiment, first set of couplers 222 is at least twice as conductive as driver electrode 210 and sensor electrode 212. In an alternative embodiment, first set of couplers 222 is comprised of substantially the same material as member 206, driver electrode 210 and sensor electrode 212. In accordance with an embodiment of the present invention, first set of couplers 222 is for electrically coupling MEMS structure 202 with the plurality of interconnects 216. In a specific embodiment, first set of couplers 222 is electrically coupled with the plurality of interconnects 216 via electrical contacts 220 housed in isolation stack 214, as depicted in FIG. 2.

Second set of couplers 224 may be comprised of any material described in association with first set of couplers 222. In accordance with an embodiment of the present invention, second set of couplers 224 is comprised of substantially the same material as first set of couplers 222. Second set of couplers may be comprised of a material suitable to anchor member 206. Thus, in accordance with an embodiment of the present invention, second set of couplers 224 is comprised of the same material as first set of couplers 222, but second set of couplers 224 is for anchoring member 206 while first set of couplers 222 is for electrically coupling driver electrode 210 and sensor electrode 212 with the plurality of interconnects 216. In one embodiment, second set of couplers 224 is also electrically coupled with the plurality of interconnects 216. In an alternative embodiment, second set of couplers 224 is electrically isolated from the plurality of interconnects 216.

Isolation stack 214 may be comprised of any material suitable to electrically isolate member 208 of MEMS structure 206 from cross-talk noise emitted from the plurality of interconnects 216. For example, isolation stack 214 may be comprised of an insulating layer. In one embodiment, the insulating layer is comprised of a material selected from the group consisting of silicon dioxide, silicon nitride, silicon oxy-nitride and a high-k dielectric layer. Isolation stack 214 may also be comprised of a highly resistive material. In accordance with an embodiment of the present invention, isolation stack 214 is comprised of a highly resistive material having a volume resistivity of greater than $1\times10^{-5}$ ohms·cm.

The plurality of interconnects 216 may be comprised of a set of conductive lines suitable to conduct a current flow. The conductive lines may be housed in a dielectric layer suitable to provide structural integrity to the plurality of interconnects 216 and to mitigate cross-talk within the plurality of interconnects 216. In an embodiment, the conductive metal lines are comprised of copper, silver, aluminum, an alloy thereof, or bundles of conductive carbon nanotubes. In one embodiment, the conductive metal lines are comprised of polycrystalline copper with an atomic composition in the range of 97-100% copper atoms. The conductive metal lines may exhibit any cross-sectional shape and follow any design rule practical for interconnect technologies. In accordance with an embodiment of the present invention, the cross-sectional shape is a square, a rectangle, a circle, an ellipse, a U, a V, a T or an A-frame cross-sectional shape. In one embodiment, the cross-sectional shape of the conductive metal lines is an artifact of the processing scheme utilized to form the plurality of interconnects 216. In a particular embodiment, at least one of the driver electrode 210 or the sensor electrode 212 is coupled with plurality of interconnects 216 by a coaxial contact 270, extending through to the plurality of semiconductor devices 218, as depicted in FIG. 2. In an embodiment, the dielectric layer that houses the conductive metal lines has a dielectric constant of in the range of 2-5.5. In one embodiment, the dielectric layer that houses the conductive metal lines is comprised of a material selected from the group consisting of silicon dioxide, a silicate, a carbon-doped oxide with 0-10% porosity or fluorinated versions thereof.

As depicted in FIG. 2, the plurality of interconnects 216 is coupled with the plurality of semiconductor devices 218 via device contacts 226. Device contacts 226 may be comprised of any conductive material suitable to withstand an IC processing scheme. In one embodiment, device contacts 226 are comprised of any of the materials described in association with first set of couplers 222 and second set of couplers 224. The plurality of semiconductor devices 218 may be any grouping of microelectronic devices that may be connected to form an integrated circuit. For example, in accordance with an embodiment of the present invention, the plurality of semiconductor devices is comprised of a plurality of N-type and P-type transistors fabricated in a substrate 230 and encased in a dielectric layer 232. The individual semiconductor devices 228 may be nested devices 228A or isolated devices 228B. Substrate 230 may be comprised of any material suitable to withstand an IC fabrication process and to provide structural integrity for the plurality of semiconductor devices 218, the plurality of interconnects 216 and MEMS structure 202. In an embodiment, substrate 230 is comprised of group IV-based materials such as crystalline silicon, germanium or silicon/germanium. In another embodiment, substrate 230 is comprised of a III-V material. Substrate 230 may also comprise an insulating layer. In one embodiment, the insulating layer is comprised of a material selected from the group consisting of silicon dioxide, silicon nitride, silicon oxy-nitride and a high-k dielectric layer. Substrate 230 may be an insulator. In one embodiment, substrate 230 consists of glass, quartz or sapphire. Dopant impurity regions 234 and isolation regions 236 may also be formed in substrate 230.

Figure 3A:
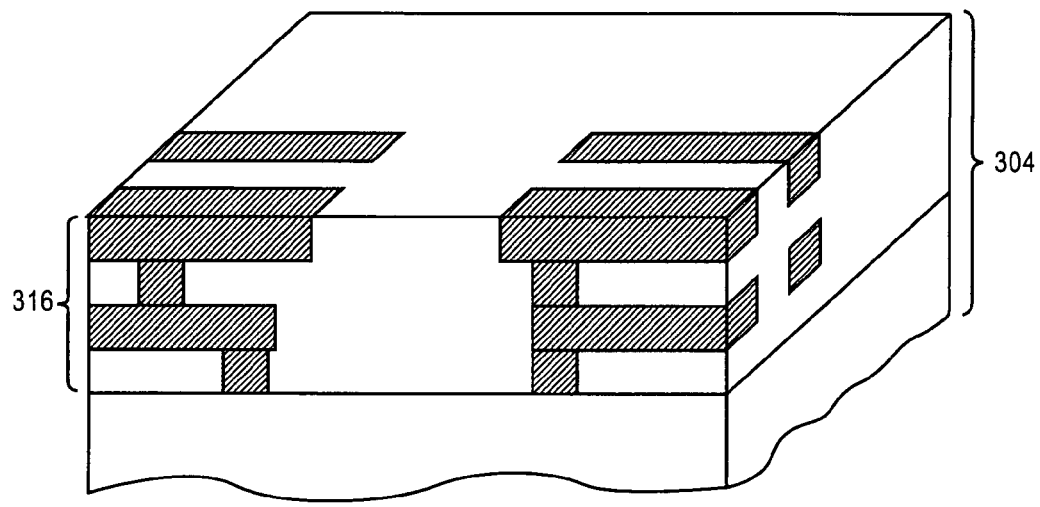
FIGS. 3A-R illustrate a cross-sectional view representing a series of steps for fabricating an IC-compatible MEMS structure, in accordance with an embodiment of the present invention.

A MEMS structure located above a plurality of interconnects may be fabricated subsequent to the fabrication of a semiconductor IC. FIGS. 3A-R illustrate a cross-sectional view representing a series of steps for fabricating an IC-compatible MEMS structure, in accordance with an embodiment of the present invention.

Referring to FIG. 3A, a semiconductor IC 304 is provided comprising a plurality of interconnects 316. Semiconductor IC 304 and plurality of interconnects 316 may be comprised of any material and/or feature described in association with semiconductor IC 204 and plurality of interconnects 216, respectively, from FIG. 2. In accordance with an embodiment of the present invention, the tolerable threshold temperature for semiconductor IC 304, i.e. the temperature up to which semiconductor IC 304 can be heated with negligible permanent degradation, is approximately 450 degrees Celsius.

Figure 3B:
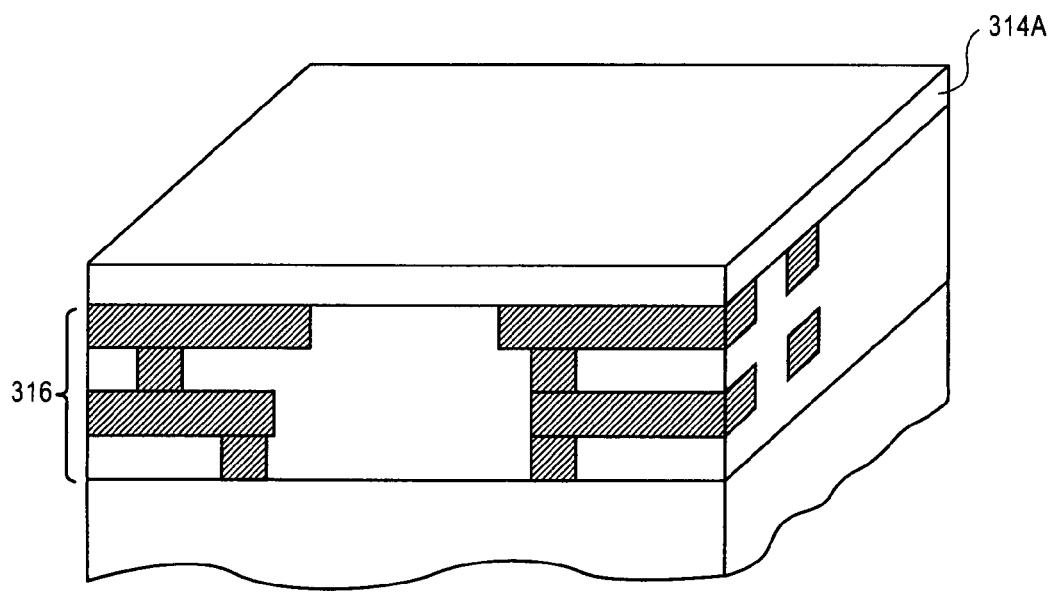

Referring to FIG. 3B, an isolation layer 314A is deposited above the plurality of interconnects 316 to form the first portion of an isolation stack. Isolation layer 314A may be comprised of any material suitable to act as an insulator layer. In accordance with an embodiment of the present invention, isolation layer 314A is comprised of any material described in association with isolation stack 214 from FIG. 2. Isolation layer 314A may be deposited by any process suitable to provide substantially uniform coverage above plurality of interconnects 316. In one embodiment, isolation layer 314A is comprised of silicon dioxide and is deposited by a chemical vapor deposition process carried out at a temperature less than approximately 450 degrees Celsius. Isolation layer 314A may be substantially flat. In one embodiment, isolation layer 314A is planarized by a chemical-mechanical process following its deposition. In a specific embodiment, the plurality of interconnects 316 is planarized prior to the deposition of isolation layer 314A. Isolation layer 314A may have a thickness suitable to suppress cross-talk from plurality of interconnects 316 with any devices subsequently fabricated above isolation layer 314A. In one embodiment, isolation layer 314A has a thickness in the range of 0.1-0.5 microns.

Figure 3C:
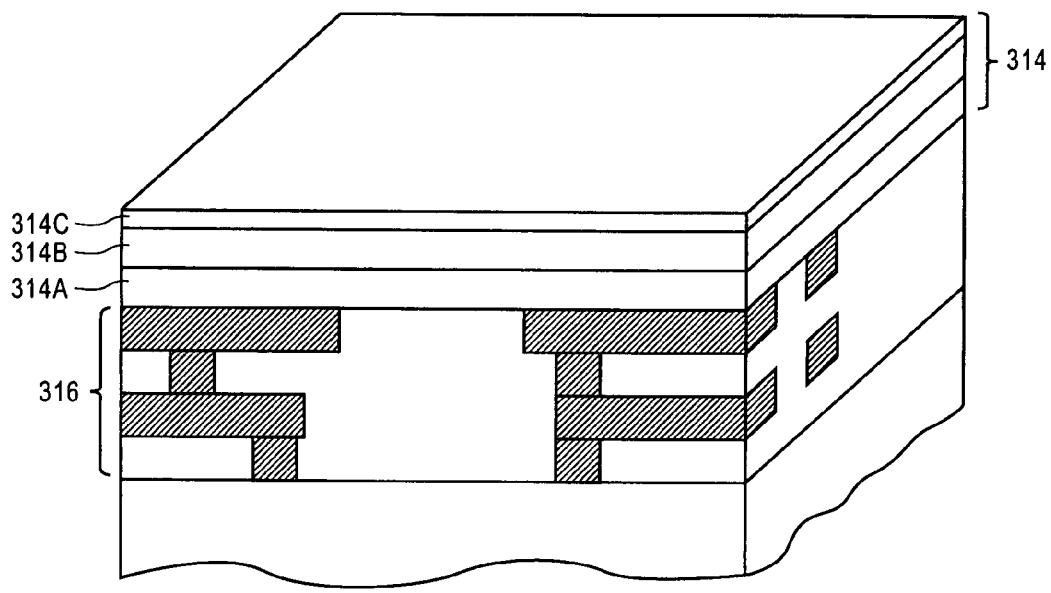

Referring to FIG. 3C, the remaining portion of an isolation stack 314, comprised of isolation layer 314A, passivation layer 314B and interface layer 314C, is formed above the plurality of interconnects 316. Passivation layer 314B may be comprised of any material suitable to house conductive electrodes. In accordance with an embodiment of the present invention, passivation layer 314B is comprised of any material described in association with isolation stack 214 from FIG. 2. Passivation layer 314B may be deposited by any process suitable to provide substantially uniform coverage above isolation layer 314A. In one embodiment, passivation layer 314B is comprised of silicon nitride and is deposited by a chemical vapor deposition process carried out at a temperature less than approximately 450 degrees Celsius. Passivation layer 314B may have a thickness suitable to form reliable electrical contacts between the plurality of interconnects 316 and a subsequently formed MEMS structure. In one embodiment, passivation layer 314B has a thickness in the range of 0.1-1 microns.

Interface layer 314C may be comprised of any material suitable to act as an etch stop layer during subsequent processing steps. In accordance with an embodiment of the present invention, interface layer 314C is comprised of any material described in association with isolation stack 214 from FIG. 2. Interface layer 314C may be deposited by any process suitable to provide substantially uniform coverage above passivation layer 314B. In one embodiment, interface layer 314C is comprised of silicon dioxide and is deposited by a chemical vapor deposition process carried out at a temperature less than approximately 450 degrees Celsius. Interface layer 314C may be substantially flat. In one embodiment, interface layer 314C is planarized by a chemical-mechanical process following its deposition. Interface layer 314C may have a thickness suitable to provide an etch stop durable for a multitude of processing steps without exposing passivation layer 314B. In one embodiment, interface layer 314C has a thickness in the range of 0.1-0.2 microns.

Figure 3D:
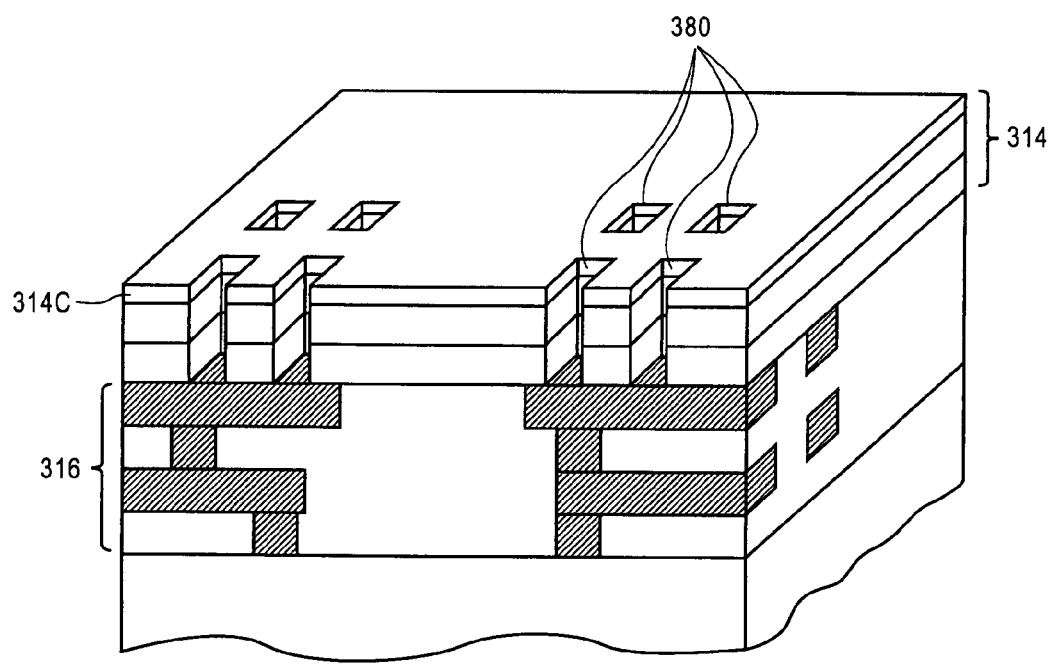

Referring to FIG. 3D, contact holes 380 are formed in isolation stack 314 to expose interconnect lines from the plurality of interconnects 316. Isolation stack 314 may be patterned by any lithographic/etch process suitable to provide the appropriate dimensions required for contact holes 380. For example, in accordance with an embodiment of the present invention, isolation stack 314 is patterned by first patterning a positive photo-resist layer above isolation stack 314 by exposure to a wavelength of light selected from the group consisting of 248 nm, 193 nm and 157 nm. In another embodiment, an e-beam direct-write process is used to pattern the positive photo-resist layer. An etch process may then be used to pattern isolation stack 314. In one embodiment, a dry etch process is used. In a particular embodiment, isolation stack 314 is comprised of layers in the order silicon dioxide/silicon nitride/silicon dioxide and the dry etch process comprises an anisotropic plasma etch process wherein the plasma is generated from a combination of the gases $CHF_3$, $CF_4$ and $O_2$. In one embodiment, interface layer 314C acts as a hard-mask layer underneath the positive photo-resist. Contact holes 380 may have any dimension suitable to define an effective electrical contact in a subsequent processing step. In one embodiment, the height:width aspect ratio of each contact hole 380 is in the range of 5:1-10:1.

Figure 3E:
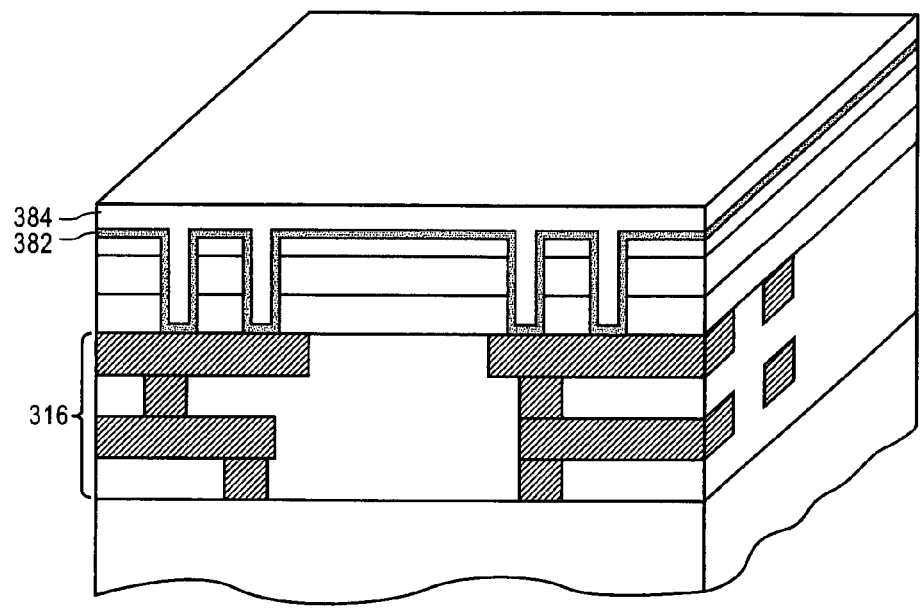

Referring to FIG. 3E, contact holes 380 are filled with contact-forming material layers. A first contact layer 382 lines contact holes 380 and a second contact layer 384 fills any remaining voids in contact holes 380. First contact layer 382 may be comprised of any conductive material that can act as a suitable adhesion layer. In one embodiment, first contact layer 382 is an adhesion layer comprised of a material that provides an optimal ohmic contact between metal lines in the plurality of interconnects 316 and second contact layer 384. In a specific embodiment, first contact layer 382 is substantially comprised of titanium. First contact layer 382 may be formed by any technique suitable to provide a conformal layer on the sidewalls of contact holes 380 and on the surface of plurality of interconnects 316. In one embodiment, first contact layer 382 is deposited by a sputter deposition process to a thickness in the range of 10-100 nanometers. In a specific embodiment, a layer of titanium nitride is formed in between first contact layer 382 and second contact layer 384 in order to enhance the adhesion between first contact layer 382 and second contact layer 384. In one embodiment, a sputter-clean is carried out prior to the deposition of first contact layer 382.

Second contact layer 384 may be comprised of any conductive material that can suitably adhere to first contact layer 382. In an embodiment, second contact layer 384 is a highly conductive semiconductor layer formed at a temperature less than approximately 450 degrees Celsius. In one embodiment, second contact layer 384 is substantially comprised of silicon germanium doped with boron dopant impurity atoms. In a specific embodiment, second contact layer 384 is comprised of silicon:germanium in the approximate ratio of 30:70 with a boron atomic concentration in the range of $10^{18}$-$10^{21}$ atoms/cm$^3$. Second contact layer 384 may be formed by any technique suitable to fill the remaining voids of contact holes 380. In one embodiment, second contact layer 384 is deposited by a chemical vapor deposition process utilizing the gases $SiH_4$, $GeH_4$ and $BCl_3$ at a temperature in the range of 400-450 degrees Celsius. In a specific embodiment, the deposition process forms silicon/germanium with a grain size in the range of 75-125 nanometers.

Figure 3F:
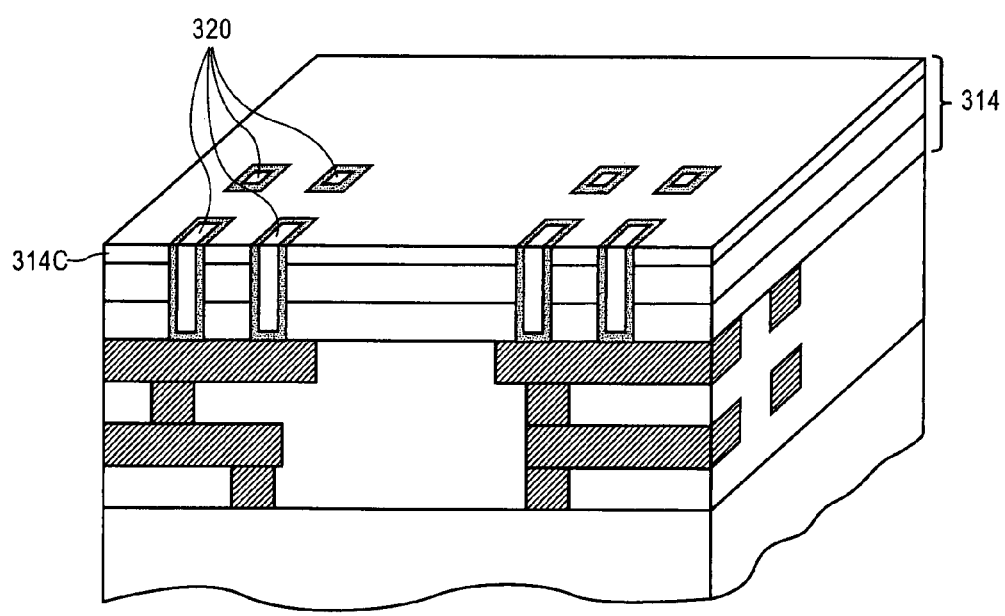

Referring to FIG. 3F, excess material from first contact layer 382 and second contact layer 384 is removed to provide electrical contacts 320 and to expose interface layer 314C of isolation stack 314. The excess material may be removed by any process suitable to leave contact holes substantially filled and to minimally impact interface layer 314C. For example, in accordance with an embodiment of the present invention, the excess material is removed by a chemical-mechanical polish process step. In another embodiment, the excess material is removed with a dry etch back process. In a specific embodiment, the excess material is removed by a plasma etch-back step comprising a plasma formed from gases selected from the group consisting of $SF_6$ or the combination of $Cl_2$, HBr, $O_2$ and $BCl_3$. In one embodiment, alignment marks are formed in the surface of interface layer 314C prior to the deposition of first release layer 390, described below.

Figure 3G:
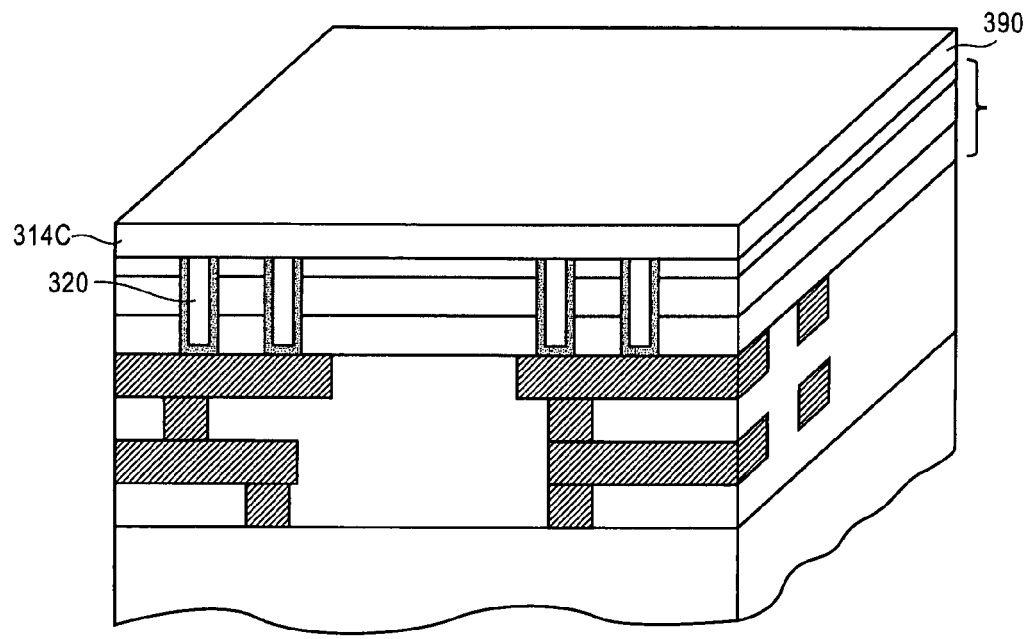

Referring to FIG. 3G, a first release layer 390 is deposited above isolation stack 314 and electrical contacts 320. First release layer 390 may be comprised of any material suitable to withstand a MEMS fabrication process. For example, in accordance with an embodiment of the present invention, first release layer 390 is comprised of a material selected from the group consisting of an insulator and a semiconductor. In one embodiment, first release layer 390 is an insulating material and is comprised of a material selected from the group consisting of silicon dioxide, silicon nitride, silicon oxy-nitride and a high-K dielectric material. In one embodiment, first release layer 390 is a semiconducting material and is selected from the group consisting of silicon, germanium, silicon/germanium, carbon-doped silicon and a III-V material. The semiconducting material may also be comprised of dopant impurity atoms. For example, in one embodiment, the concentration of dopant impurity atoms is selected to optimize the germanium nucleation from $GeH_4$ precursor gas at a temperature in the range of 300-400° C. In a specific embodiment, first release layer 390 is comprised of greater than 98% germanium atoms and boron dopant impurity atoms having a total atomic concentration in the range of $5\times10^{19}$-$5\times10^{20}$ atoms/cm$^3$. First release layer 390 may be comprised of any material that may subsequently be removed with high selectivity to interface layer 314C and a subsequently formed structural layer. For example, in accordance with an embodiment of the present invention, interface layer 314C is comprised of an insulator layer, a subsequently formed structural layer is comprised of silicon/germanium and first release layer 390 substantially comprises germanium. In a specific embodiment, both the silicon/germanium structural layer and the germanium release layer 390 are doped with boron dopant impurity atoms. The thickness of first release layer 390 may be any thickness suitable to provide a suspended member at a desired distance above an isolation stack. Thus, in accordance with an embodiment of the present invention, the thickness of first release layer 390 is substantially the same as the thicknesses described in association with the height that suspended member 208 is suspended above isolation stack 214 from FIG. 2.

Figure 3H:
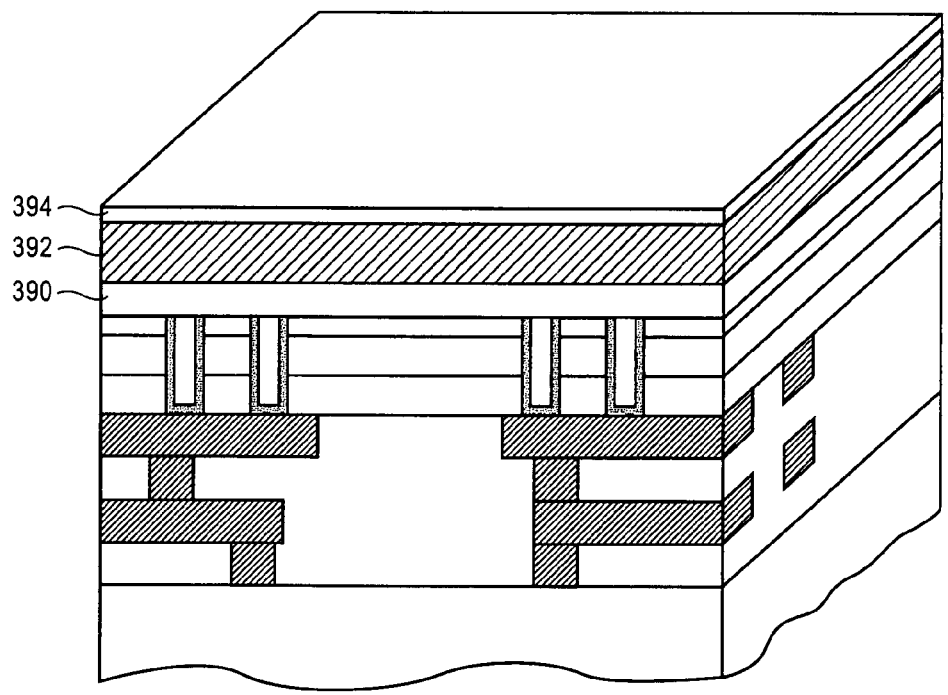

Referring to FIG. 3H, a first structural layer 392 is formed above first release layer 390. First structural layer 390 may be comprised of any material and have any thickness described in association with member 206 from FIG. 2. First structural layer 392 and first release layer 390 may be formed by any suitable deposition process that generates uniform material layers of consistent composition. For example, in accordance with an embodiment of the present invention, first structural layer 392 and first release layer 390 are deposited by a process selected from the group consisting of chemical vapor deposition, physical vapor deposition, atomic layer deposition, electroplating and electro-less plating. First structural layer 392 and first release layer 390 may be deposited by a low temperature deposition process. In one embodiment, first structural layer is deposited by a chemical vapor deposition using the gases $SiH_4$, $GeH_4$ and $BCl_3$ and first release layer is deposited by a chemical vapor deposition using the gases $GeH_4$ and $BCl_3$. In a specific embodiment, first structural layer 392 and first release layer 390 are deposited by a low-pressure chemical vapor deposition process at a temperature less than 450° C. A hard-mask layer 394 may be deposited above first structural layer 392, as depicted in FIG. 3H. In one embodiment, the hard-mask layer 394 is comprised of a material selected from the group consisting of silicon dioxide and silicon oxy-nitride. In a specific embodiment, the hard-mask layer 394 is comprised of silicon dioxide formed from a plasma-enhanced chemical vapor deposition process step.

Figure 3I:
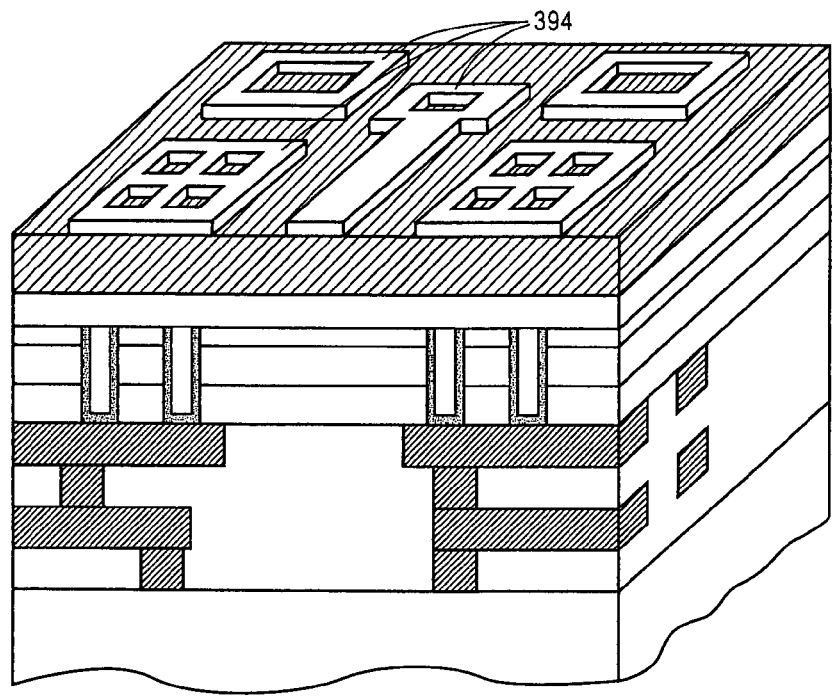

Referring to FIG. 3I, hard-mask layer 394 is patterned with features desirable for the fabrication of a MEMS structure. Hard-mask layer 394 may be patterned by any suitable patterning process that provides well-defined features of the appropriate dimensions. For example, in accordance with an embodiment of the present invention, hard-mask layer 394 is patterned by first patterning a positive photo-resist layer above hard-mask layer 394 by exposure to a wavelength of light selected from the group consisting of 248 nm, 193 nm and 157 nm. In another embodiment, an e-beam direct-write process is used to pattern the positive photo-resist layer. In one embodiment, hard-mask layer 394 is etched by a dry etch process utilizing the gases $CHF_3$, $CF_4$ and $O_2$.

Figure 3J:
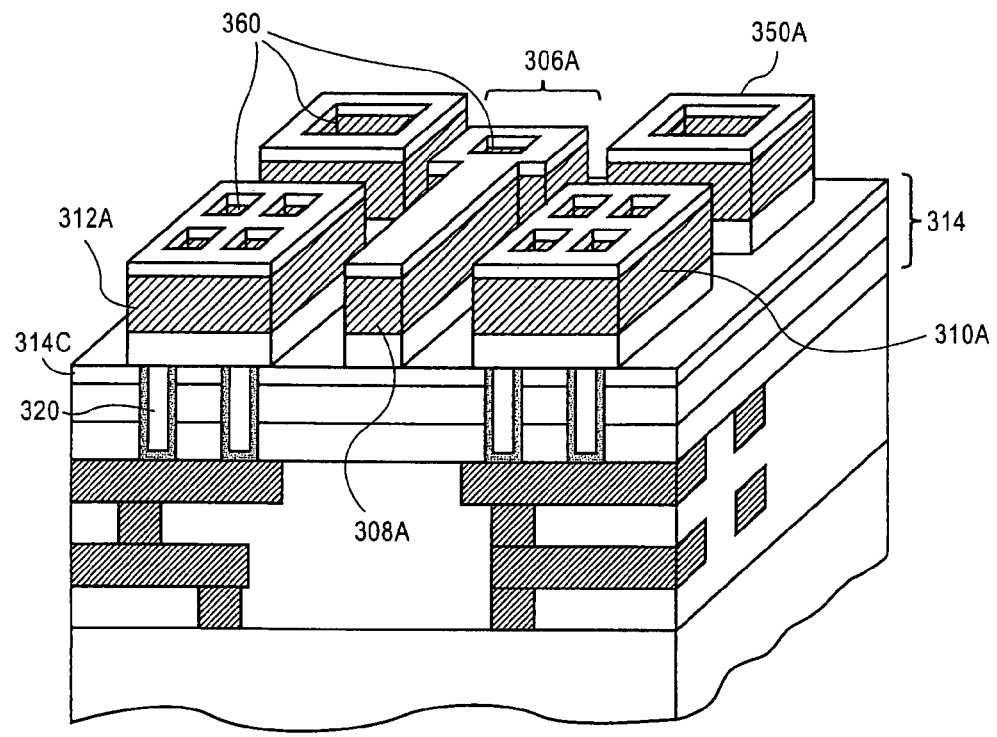

Referring to FIG. 3J, first structural layer 392 and first release layer 390 are patterned to form pre-coupled member 306A, pre-coupled electrodes 310A and 312A and pre-coupled dummy structures 350A. The width and length of the pre-suspended portion 308A of pre-coupled member 306A may be any width and length described in association with suspended portion 208 from FIG. 2. A dry etch process may be used to pattern first structural layer 392 and first release layer 390. In one embodiment, first structural layer 392 is comprised of silicon/germanium, first release layer 390 is comprised of germanium and the dry etch process comprises using the gases HBr, $Cl_2$ and $O_2$. In one embodiment, interface layer 314C acts as an etch stop during the patterning of first structural layer 392 and first release layer 390. Coupler holes 360 may also be formed in pre-coupled member 306A, pre-coupled electrodes 310A and 312A and pre-coupled dummy structures 350A, as depicted in FIG. 3J. In accordance with an embodiment of the present invention, coupler holes 360 of pre-coupled electrodes 310A and 312A are substantially aligned with electrical contacts 320 while coupler holes 360 of pre-coupled member 306A are aligned with the top surface of interface layer 314C and, thus, isolation stack 314.

Figure 3K:
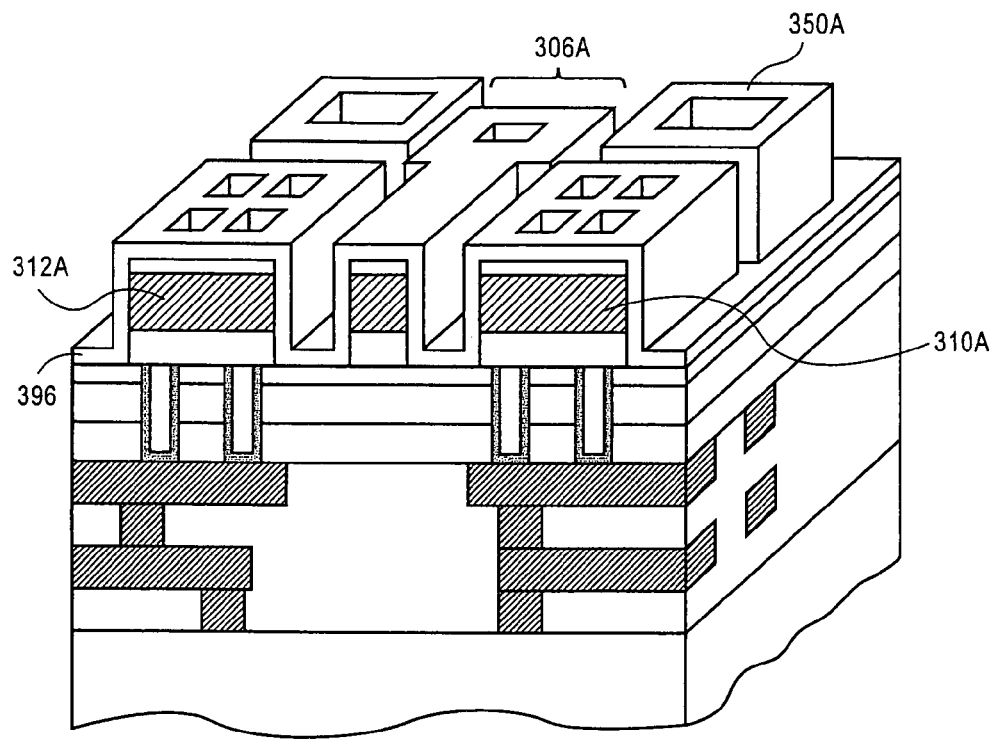

Referring to FIG. 3K, a second release layer 396 is deposited above pre-coupled member 306A, pre-coupled electrodes 310A and 312A and pre-coupled dummy structures 350A. Second release layer 396 may be comprised of any material described in association with first release layer 390 from FIG. 3G. In accordance with an embodiment of the present invention, second release layer 396 is formed from substantially the same material as first release layer 390. In an alternative embodiment, second release layer 396 is formed from a different material than first release layer 390. Second release layer may be formed to a thickness suitable to provide a spacing between pre-suspended portion 308A and a subsequently formed second structural layer. In one embodiment, the thickness of second release layer 396 is in the range of the spacing between suspended portion 208 and electrodes 210 and 212 from FIG. 2.

Figure 3L:
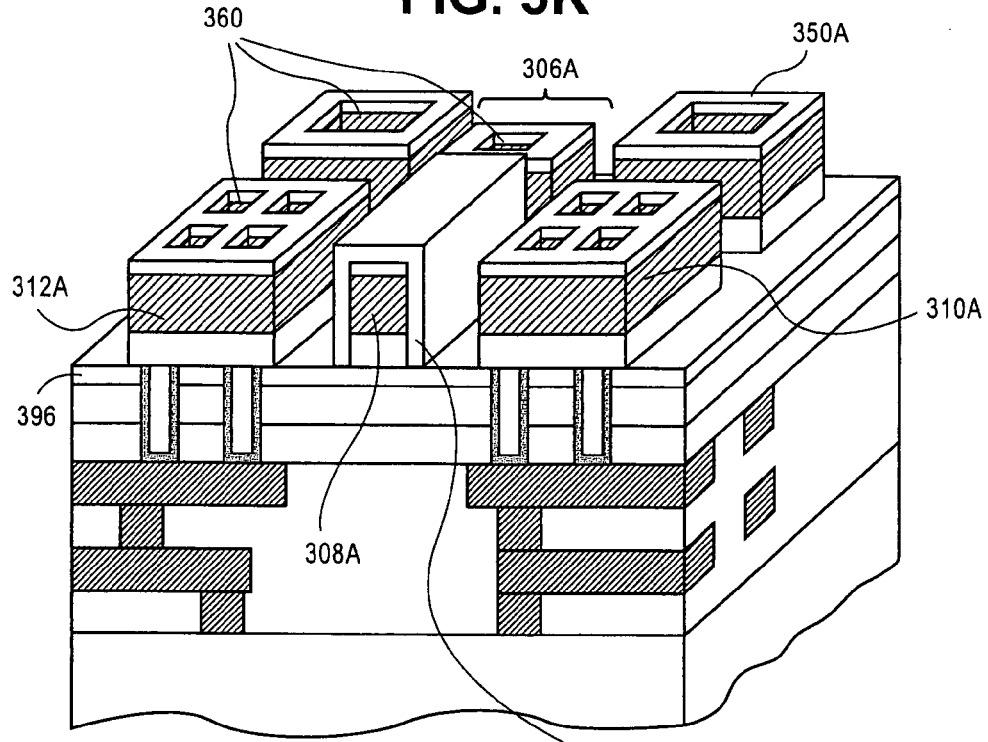

Referring to FIG. 3L, the second release layer 396 is patterned to form sidewall release layer 397 surrounding pre-suspended portion 306A of pre-coupled member 306A. Second release layer 396 may be patterned with a mask designed to retain portions of second release layer 396 on pre-suspended portion 308A, while enabling removal from the sidewalls of pre-coupled electrodes 310A and 312A and from inside coupler holes 360, as depicted in FIG. 3L. In one embodiment, second release layer 396 is comprised substantially of germanium atoms and is patterned with a dry etch process comprising the gases $SF_6$ or the combination of $Cl_2$, HBr, $O_2$ and $BCl_3$. In one embodiment, interface layer 314C acts as an etch stop during the patterning of second release layer 396.

Figure 3M:
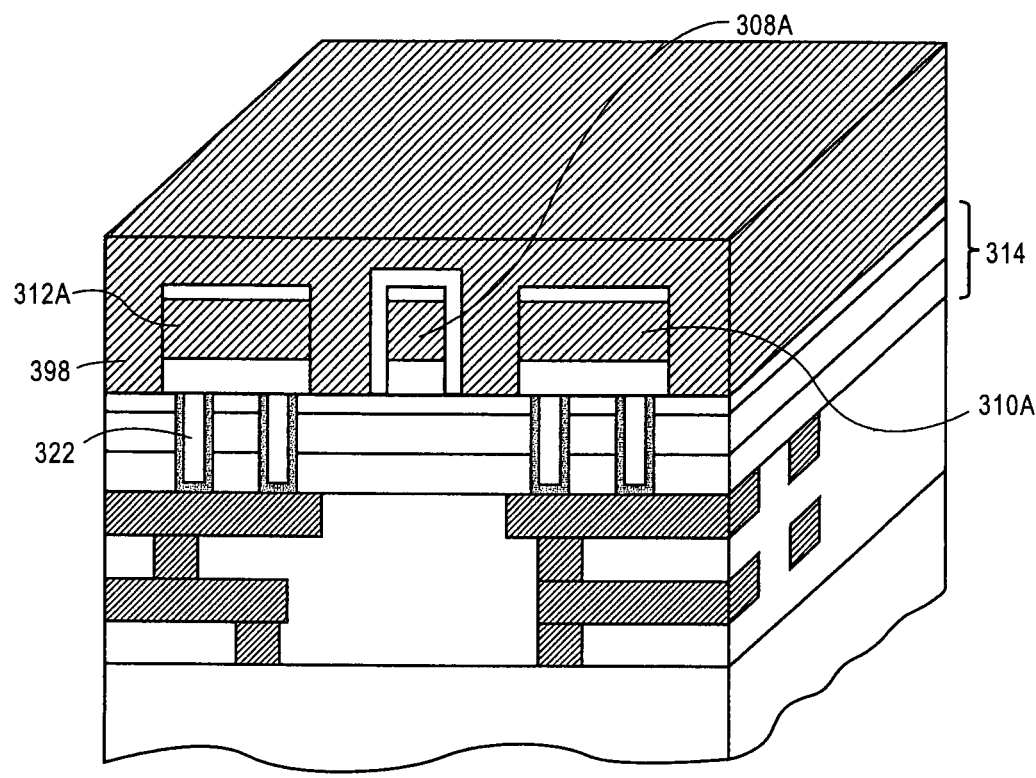

Referring to FIG. 3M, a second structural layer 398 is deposited above pre-coupled member 306A and pre-coupled electrodes 310A and 312A and in coupler holes 360, in order to form couplers. Second structural layer may be comprised of any material and deposited by any technique described in association with first structural layer 392 from FIG. 3H. In accordance with an embodiment of the present invention, second structural layer 398 is comprised of substantially the same material as first structural layer 392. Alternatively, second structural layer 398 may be comprised of a highly conductive material. For example, in accordance with an embodiment of the present invention, second structural layer 398 is comprised of a material selected from the group consisting of a semiconductor material heavily doped with charge-carrier impurity atoms and a conductor. In one embodiment, second structural layer 398 is a heavily doped semiconducting material and is selected from the group consisting of silicon, germanium, silicon/germanium, carbon-doped silicon and a III-V material. In a specific embodiment, second structural layer 398 is comprised of a group IV material and is heavily doped with charge-carrier impurity atoms selected from the group consisting of boron, indium, phosphorus, arsenic and antimony. For example, in a particular embodiment, second structural layer 398 is comprised of polycrystalline silicon/germanium with a germanium atomic concentration in the range of 55-95% and boron dopant impurity atoms with a total atomic concentration in the range of $1\times10^{20}$-$5\times10^{22}$ atoms/cm$^3$. In another embodiment, second structural layer 398 is comprised of a group III-V material and is heavily doped with charge-carrier impurity atoms selected from the group consisting of carbon, silicon, germanium, oxygen, sulfur, selenium and tellurium. In one embodiment, second structural layer 398 is comprised of a conductor and is formed from a material selected from the group consisting of copper, aluminum, a metal alloy and a metal silicide. A low temperature process may be used to form second structural layer 398. Thus, in accordance with another embodiment of the present invention, second structural layer 398 is comprised of a material formed at a temperature less than approximately 450° C. Additionally, second structural layer 398 may be comprised of a material having a low resistivity. For example, in one embodiment, second structural layer 398 is comprised of a material having a volume resistivity less than $1\times10^{-5}$ ohms·cm. In comparison with first structural layer 392, second structural layer 398 may be relatively more conductive than first structural layer 392. In an embodiment, second structural layer 398 is at least twice as conductive as first structural layer 392. In accordance with an embodiment of the present invention, second structural layer 398 is for electrically coupling pre-coupled electrodes 310A and 312A with electrical contacts 320 and for anchoring pre-coupled member 306A to isolation stack 314.

Figure 3N:
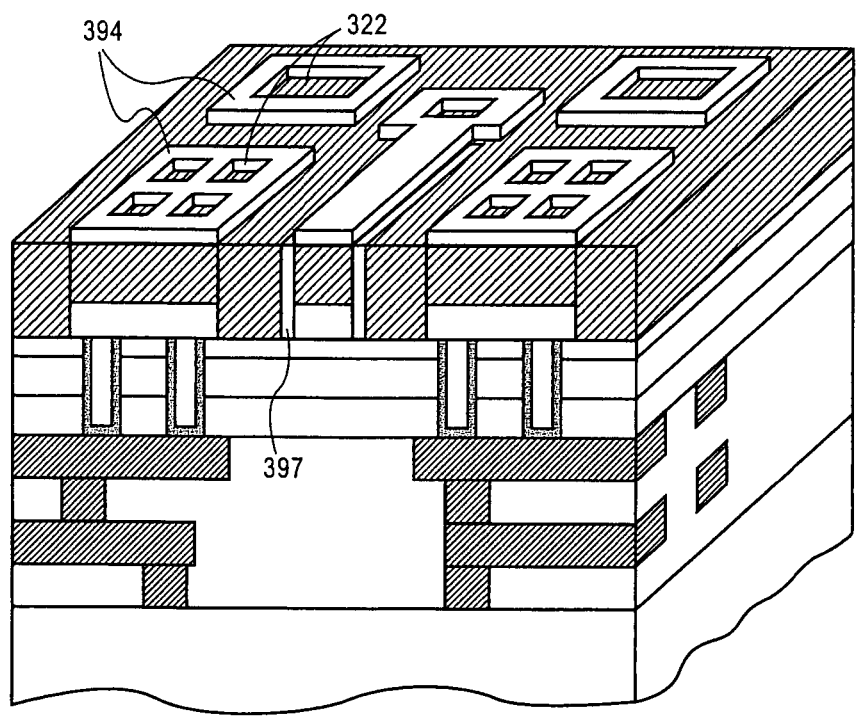

Referring to FIG. 3N, second structural layer 398 is etched-back to expose hard-mask layer 394, sidewall release layer 397 and couplers 322. In an embodiment, second release layer 396 is comprised substantially of silicon/germanium and is etched-back with a dry etch process comprising the gases SF$_6$ or the combination of Cl$_2$, HBr, O$_2$ and BCl$_3$. In one embodiment, hard-mask layer 394 acts as an end-point determiner during the etch-back of second structural layer 398.

Figure 3O:
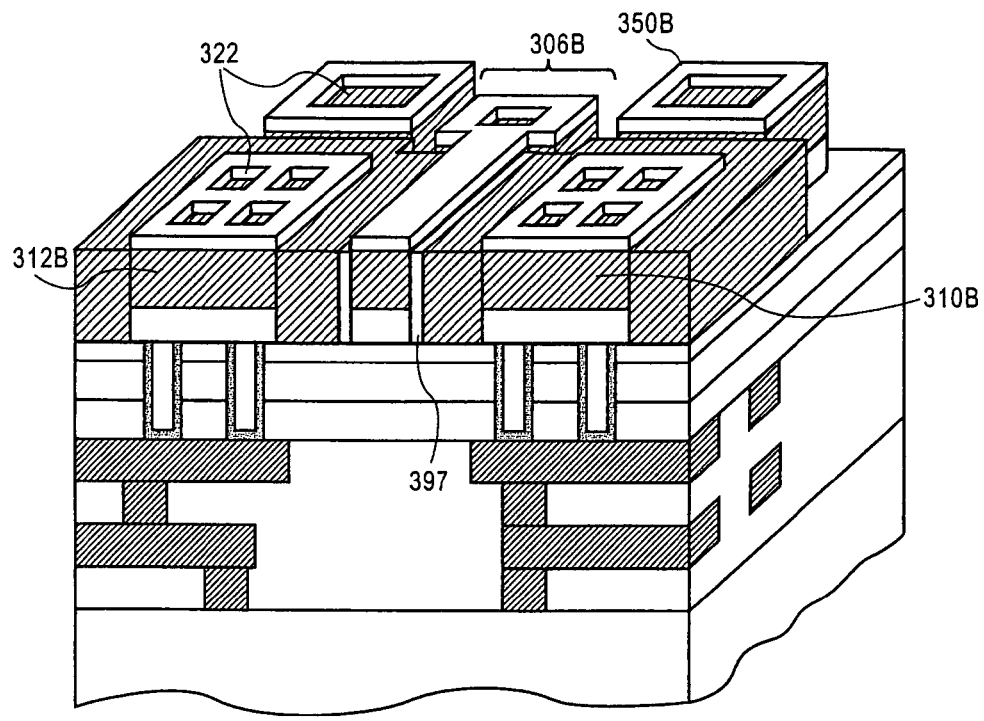

Referring to FIG. 3O, second structural layer 398 is patterned to form coupled member 306B, coupled electrodes with extensions 310B and 312B and coupled dummy structures 350B. Second structural layer may be patterned with any process described in association with the patterning of first structural layer 392 and with any design to provide the desired extension on pre-coupled electrodes 310A and 312B, in addition to providing couplers 322. For example, in accordance with an embodiment of the present invention, second structural layer 398 is patterned to form electrode extensions on coupled electrodes with extensions 310B and 312B, wherein the extensions are directly adjacent to sidewall release layer 397.

Figure 3P:
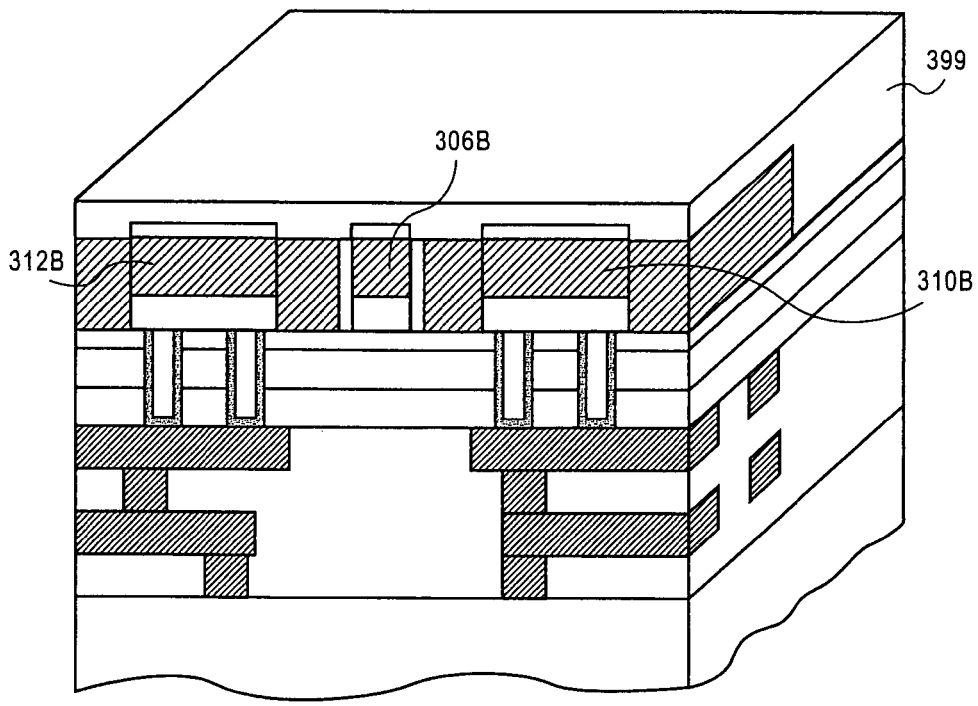

Referring to FIG. 3P, a sacrificial polish layer 399 is deposited above coupled member 306B, coupled electrodes with extensions 310B and 312B and coupled dummy structures 350B. Sacrificial polish layer 399 may be comprised of any material suitable to withstand a uniform planarization process and that can be deposited at a temperature less than approximately 450 degrees Celsius. In accordance with an embodiment of the present invention, sacrificial polish layer 399 is comprised of any material described in association with first release layer 390 and second release layer 396. In a specific embodiment, sacrificial polish layer 399 is comprised substantially of germanium.

Figure 3Q:
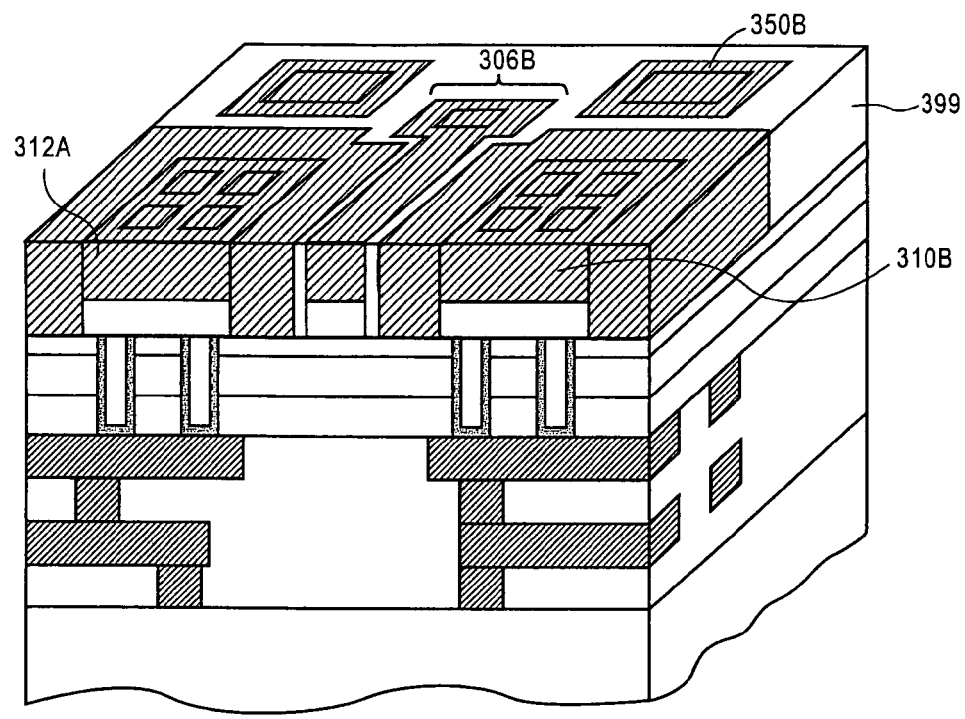
Figure 3R:
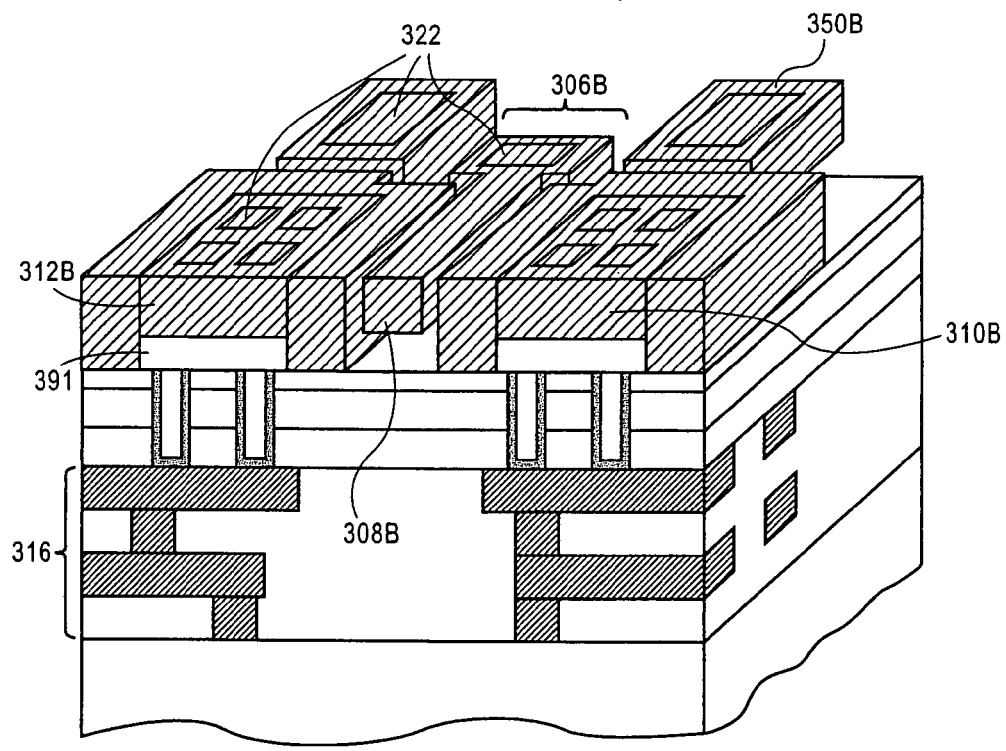

Referring to FIG. 3Q, sacrificial polish layer 399 is etched-back to a depth sufficient to expose hard-mask layer 394. In one embodiment, sacrificial polish layer 399 is comprised substantially of germanium and is etched-back with a dry etch process using the gases SF$_6$ or the combination Cl$_2$, HBr, O$_2$ and BCl$_3$. Hard-mask layer 394 may then be planarized by any planarization step suitable to selectively remove hard-mask layer 394 without significantly damaging coupled member 306B, coupled electrodes with extensions 310B and 312B and coupled dummy structures 350B. In accordance with an embodiment of the present invention, hard-mask layer 394 is planarized with a chemical-mechanical process step. In one embodiment, sacrificial polish layer 399 prevents the intrusion of slurry residue during the removal of hard-mask layer 394. In an alternative embodiment, a sacrificial polish layer is not employed and hard-mask layer 394 is removed directly following the patterning of second structural layer 398, described in association with FIG. 3O.

Referring to FIG. 3R, sacrificial polish layer 399, sidewall release layer 397 and first release layer 390 are removed to form suspended portion 308B of coupled member 306B. Sacrificial polish layer 399, sidewall release layer 397 and first release layer 390 may be removed by any process suitable to provide high selectivity to coupled member 308B, coupled electrodes with extensions 310B and 312B, coupled dummy structures 350B and couplers 322. In accordance with an embodiment of the present invention, sacrificial polish layer 399, sidewall release layer 397 and first release layer 390 are all comprised of different materials and are removed in three distinct process steps. In an alternative embodiment, sacrificial polish layer 399, sidewall release layer 397 and first release layer 390 are comprised of substantially the same material and are removed in the same process step. For example, in one embodiment, coupled member 308B, coupled electrodes with extensions 310B and 312B, coupled dummy structures 350B and couplers 322 are all comprised of silicon/germanium, while sacrificial polish layer 399, sidewall release layer 397 and first release layer 390 are comprised substantially of germanium and are removed by an oxidizing etchant. In a specific embodiment, sacrificial polish layer 399, sidewall release layer 397 and first release layer 390 are comprised of germanium with an atomic concentration of greater than 98% germanium atoms and a wet etchant comprising an aqueous solution of H$_2$O$_2$ with a concentration in the range of 25-35% by volume and a temperature in the range of 80-95° C. is used. In an embodiment, sacrificial polish layer 399, sidewall release layer 397 and first release layer 390 are removed with a selectivity greater than 20:1 over coupled member 308B, coupled electrodes with extensions 310B and 312B, coupled dummy structures 350B and couplers 322.

It is to be understood that the patterning of second structural layer 398 may be chosen to provide any structural arrangement desired for the fabricated MEMS structure. For example, in accordance with an embodiment of the present invention, second structural layer 398 is patterned to completely surround pre-coupled electrodes 310A and 312B and, hence, to protect couplers 322 of coupled electrodes with extensions 310B and 312B. Thus, in a specific embodiment, residual portions 391 of first release layer 390 are encapsulated and retained in the final MEMS structure, as depicted in FIG. 3R. Other couplers, such as couplers 322 of dummy structures 350B may not require protection. Thus, in accordance with an embodiment of the present invention, those structures not electrically coupled with the plurality of interconnects 316 are not surrounded with a protective portion of structural material during the patterning of second structural layer 398. For such structures, portions of first release layer 390 are not retained, as is also depicted in FIG. 3R.

Figure 4:
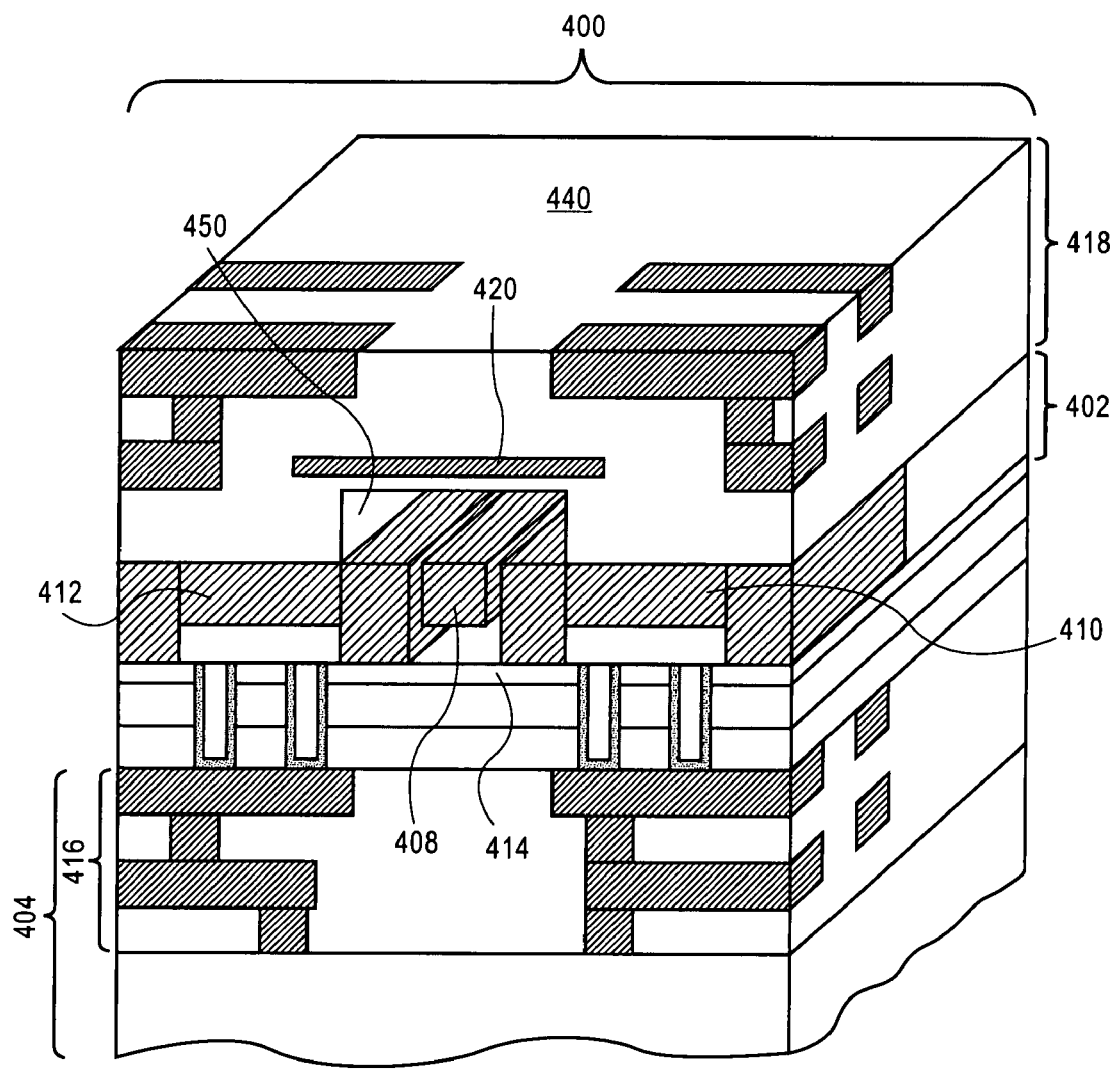
FIG. 4 illustrates a cross-sectional view representing an IC-compatible MEMS structure in between two sets of interconnects, in accordance with an embodiment of the present invention.

A MEMS structure may be fabricated having a resonating member located between two pluralities of interconnects, one above the MEMS structure and one below the MEMS structure. FIG. 4 illustrates a cross-sectional view representing an IC-compatible MEMS structure in between two sets of interconnects, in accordance with an embodiment of the present invention.

Referring to FIG. 4, a structure 400 comprises a MEMS structure 402 integrated above a semiconductor IC 404. MEMS structure 402 comprises a member having a suspended portion 408 in between a driver electrode 410 and a sensor electrode 412 and suspended above an isolation layer 414. Semiconductor IC 404 comprises a first plurality of interconnects 416. In accordance with an embodiment of the present invention, the first plurality of interconnects 416 is fabricated prior to the fabrication of MEMS structure 402. A second plurality of interconnects 418 is formed above MEMS structure 402. In accordance with an embodiment of the present invention, the second plurality of interconnects 418 is fabricated after the fabrication of MEMS structure 402. MEMS structure 402 is protected from the second plurality of interconnects 418 by a shield layer 420. Suspended portion 408 of MEMS structure 402 is anchored to isolation layer 414 and is free from overlying dielectric layer 440. Thus, in accordance with an embodiment of the present invention, suspended portion 408 is housed in a cavity 450. In a specific embodiment, the pressure inside of cavity 450 is less than ambient.

Thus, an IC-compatible MEMS structure and a method to form such a structure have been disclosed. In an embodiment, an integrated circuit having a MEMS device is formed. The structure comprises a plurality of semiconductor devices formed on a substrate. A plurality of interconnects is above and coupled with the plurality of semiconductor devices, incorporating the plurality of semiconductor devices into the integrated circuit. A MEMS resonator is formed above and coupled with the plurality of interconnects. In one embodiment, the MEMS resonator is comprised of a member and a pair of electrodes. The pair of electrodes is electrically coupled with the plurality of interconnects. In one embodiment, the member is also coupled with the plurality of interconnects. In another embodiment, the member is isolated from the plurality of interconnects. In a specific embodiment, all process steps used to form the MEMS resonator are carried out at a temperature less than approximately 450° C.

What is claimed is:

1. An integrated circuit having a MEMS device, comprising:
   a plurality of semiconductor devices formed on a substrate;
   a plurality of interconnects above and coupled with said plurality of semiconductor devices, wherein said plurality of interconnects incorporates said plurality of semiconductor devices into said integrated circuit; and
   a MEMS resonator above and coupled with said plurality of interconnects, wherein said MEMS resonator is comprised of a member, a driver electrode and a sensor electrode, wherein said driver electrode and said sensor electrode are electrically coupled with said plurality of interconnects.

2. The integrated circuit of claim 1 wherein said member is also electrically coupled with said plurality of interconnects.

3. The integrated circuit of claim 1 wherein said member is electrically isolated from said plurality of interconnects.

4. The integrated circuit of claim 1 wherein said member, said driver electrode and said sensor electrode are all in the same plane.

5. The integrated circuit of claim 1 wherein said member comprises a resonating portion selected from the group consisting of a cantilever arm, a beam, a tuning fork and a plate.

6. The integrated circuit of claim 1 wherein said driver electrode and said sensor electrode are electrically coupled with said plurality of interconnects by a first set of couplers, wherein said member is anchored by a second set of couplers, and wherein said first and second sets of couplers are comprised of the same material.

7. The integrated circuit of claim 6 wherein at least one of said driver electrode and said sensor electrode is coupled with said plurality of interconnects by a coaxial contact extending through to said plurality of semiconductor devices.

8. The integrated circuit of claim 1, further comprising:
   a second plurality of interconnects above said MEMS resonator.

9. The integrated circuit of claim 1 wherein said MEMS resonator is a clocking device.

10. A method of fabricating an integrated circuit having a MEMS device, comprising:
    forming a plurality of semiconductor devices on a substrate;
    forming a plurality of interconnects coupled with said plurality of semiconductor devices, wherein said plurality of interconnects incorporates said plurality of semiconductor devices into said integrated circuit; and,
    subsequent to forming said plurality of semiconductor devices and said plurality of interconnects, forming a MEMS resonator coupled with said plurality of interconnects, wherein said MEMS resonator is comprised of a member and a pair of electrodes, wherein said pair of electrodes is electrically coupled with said plurality of interconnects.

11. The method of claim 10 wherein all process steps used to form said MEMS resonator are carried out at temperatures less than 450 degrees Celsius.

12. The method of claim 10 wherein said member comprises a resonating portion selected from the group consisting of a cantilever arm, a beam, a tuning fork and a plate.

13. The method claim 10 wherein said pair of electrodes is electrically coupled with said plurality of interconnects by a first set of couplers, wherein said member is anchored by a second set of couplers, and wherein said first and second sets of couplers are comprised of the same material.

14. The method of claim 13 wherein at least one electrode of the pair of electrodes is coupled with said plurality of interconnects by a coaxial contact extending through to said plurality of semiconductor devices.

15. The method of claim 10, further comprising:
    subsequent to forming said MEMS resonator, forming a second plurality of interconnects above said MEMS resonator.

16. The method of claim 10 wherein said MEMS resonator is a clocking device.

17. A method of fabricating an integrated circuit having a MEMS device, comprising:
  providing a substrate having a plurality of semiconductor devices incorporated into an integrated circuit by a plurality of interconnects;
  forming an isolation layer above said plurality of interconnects;
  forming a first set and a second set of conductive couplers in said isolation layer and connected with said plurality of interconnects;
  forming a first release layer above said isolation layer;
  forming a first structural layer above said first release layer;
  patterning said first structural layer and said first release layer to form a member, a driver electrode and a sensor electrode above a patterned first release layer, wherein said driver electrode is above said first set of conductive couplers, wherein said sensor electrode is above said second set of conductive couplers, and wherein said member is in between said driver and said sensor electrodes;
  forming coupler holes in each of said member, said driver electrode and said sensor electrode, wherein said coupler holes extend through said patterned first release layer;
  forming a second release layer adjacent to the sidewalls of said member;
  forming a second structural layer adjacent to said driver and said sensor electrodes, adjacent to said second release layer, and in said coupler holes; and
  removing at least a portion of each of said patterned first and said second release layers.

18. The method of claim 17 wherein forming said second structural layer in said coupler holes provides couplers for each of said member, said driver electrode and said sensor electrode, wherein providing the couplers anchors said member, wherein providing the couplers electrically couples said driver electrode with said first set of conductive couplers, and wherein providing the couplers electrically couples said sensor electrode with said second set of conductive couplers.

19. The method of claim 18 wherein all process steps used to form said MEMS resonator are carried out at temperatures less than 450 degrees Celsius.

20. The method of claim 17 wherein forming a second structural layer encapsulates a portion of said patterned first release layer underneath said driver and said sensor electrodes.

21. The method of claim 20 wherein removing the at least said portion of each of said patterned first and said second release layers comprises retaining the encapsulated portion of said patterned first release layer.

22. The method of claim 17 wherein removing the at least said portion of each of said patterned first and said second release layers provides a resonating portion of said member.

23. The method of claim 22 wherein said first and said second structural layers comprise polycrystalline silicon/germanium with an atomic germanium concentration in the range of 50-70% and a boron dopant impurity atomic concentration in the range of $1 \times 10^{18}$-$5 \times 10^{20}$ atoms/cm$^3$, wherein said first and said second release layers are comprised of germanium with an atomic concentration of greater than 98% germanium atoms and a boron dopant impurity atomic concentration in the range of $5 \times 10^{19}$-$5 \times 10^{20}$ atoms/cm$^3$, and wherein removing the at least said portion of each of said patterned first release layer and said second release layer consists of applying a wet etchant comprising and an aqueous solution of hydrogen peroxide with an $H_2O_2$ concentration in the range of 25-35% by volume and a temperature in the range of 80-95° C.

24. The method of claim 17 wherein said member is a component of a MEMS clocking device.

* * * * *